United States Patent [19]
Tamagawa

[11] Patent Number: 5,754,078
[45] Date of Patent: May 19, 1998

[54] OPERATIONAL AMPLIFIER FOR CLASS B AMPLIFICATION

[75] Inventor: Akio Tamagawa, Tokyo, Japan

[73] Assignee: NEC Corporation, Tokyo, Japan

[21] Appl. No.: 633,969

[22] Filed: Apr. 19, 1996

[30] Foreign Application Priority Data

Apr. 21, 1995  [JP]  Japan ................................. 7-096464

[51] Int. Cl.$^6$ ..................................................... H03F 3/30
[52] U.S. Cl. .......................... 330/255; 330/264; 330/268
[58] Field of Search ................................. 330/253, 255, 330/264, 268

[56] References Cited

U.S. PATENT DOCUMENTS

| | | | |
|---|---|---|---|
| 4,296,382 | 10/1981 | Hoover | 330/264 |
| 4,987,381 | 1/1991 | Butler | 330/264 X |
| 5,361,041 | 11/1994 | Lish | 330/255 |

FOREIGN PATENT DOCUMENTS

| | | |
|---|---|---|
| 56501268 | 9/1981 | Japan. |
| 6382006 | 4/1988 | Japan. |
| 4129410 | 4/1992 | Japan. |

OTHER PUBLICATIONS

Large Swing CMOS Power Amplifier, Kevin E. Brehmer and James B. Wieser pp. 624–629, Dec. 1983, IEEE J. of Solid–State Circuits, vol. SC–18, No. 6.

A High–Performance CMOS Amplifier, John A. Fisher; pp. 1200–1205 Dec. 1985 IEEE J. of Solid–State Circuits, vol. SC–20, No. 6.

*Primary Examiner*—James B. Mullins
*Attorney, Agent, or Firm*—Helfgott & Karas P.C.

[57] ABSTRACT

A first current mirror circuit 6 inversion amplifies the output voltage of an operational amplifier 10 with high potential power supply potential $V_{DD}$ to a voltage with a ground potential as a reference, thus driving a p-MOS transistor $Q_{P3}$ of a push-pull output stage 19. A second current mirror circuit 7 inversion amplifies the output voltage of the operational amplifier 10 with the ground potential as a reference to a voltage with high potential power supply voltage $V_{DD}$ as a reference, thus driving the n-MOS transistor $Q_{N3}$ in the push-pull output stage 19. Thus push-pull output stage through current when the input voltage is suddenly switched is eliminated and crossover distortion is reduced.

5 Claims, 9 Drawing Sheets

OPERATIONAL AMPLIFIER FOR CLASS B AMPLIFICATION

BACKGROUND OF THE INVENTION

The present invention relates to operational amplifiers for class B power amplification, which may be suitably used for, for instance, voice coil motors of hard disk drive apparatuses and which is capable of preventing AC through current and crossover distortion reduction.

Operational amplifiers for power amplification, i.e., power operational amplifiers, are shown in IEEE Journal of Solid-State Circuits, SC-18, No. 6, Dec. 12, 1983, pp. 624–629, and also in IEEE Journal of Solid-State Circuits, SC-20, No. 6, Dec. 12, 1986, pp. 1200–1205. One such power operational amplifier is shown in FIG. 8. The illustrated power operational amplifier comprises a first operational amplifier 10, a second operational amplifier 23, a third operational amplifier 24 and a push-pull output stage 19. The output of the first operational amplifier 10 is fed to inverted input terminals of the second and third operational amplifiers 23 and 24. The output of the second operational amplifier 23 drives a p-MOS transistor $Q_{P3}$ in the push-pull output stage 19, and the output of the third operational amplifier 24 is coupled to an n-MOS transistor $Q_{N3}$ of the push-pull output stage 19. The output signal of the push-pull output stage 19 is fed back to non-inverted input terminals of the second and third operational amplifiers 23 and 24. By making the potential IN$_+$ on the non-inverted terminal 3 of the first operational amplifier 23 to be higher than the potential IN_ at the inverted input terminal 4 which is held fixed, a high level signal is produced. This signal is fed to the inverted input terminals of the second and third operational amplifiers 23 and 24. The second operational amplifier 23 thus outputs a low level signal to turn on the p-MOS transistor QP3 in the push-pull output stage 19. The third operational amplifier 24 likewise outputs a low level signal to turn off an n-MOS transistor $Q_{N3}$ in the push-pull output stage 19. As a result, the output OUT from the output terminal of this power operational amplifier is inverted to a high level.

By making the potential IN_ at the non-inverted input terminal 3 of the first operational amplifier 10 to be lower than the potential IN_ at the non-inverted input terminal 4, the output OUT of the output terminal 5 of the power operational amplifier is inverted to a low level by the converse operation.

When the inverted and non-inverted input terminals 4 and 3 of the first operational amplifier 10 are at an equal potential, the first operational amplifier 10 outputs one half the power supply voltage $V_{DD}$ to be fed to the inverted input terminals of the second and third operational amplifiers 23 and 24. The potential at the output terminal 5 of the power operational amplifier 5 is fed back to the non-inverted input terminals of the second and third operational amplifiers 23 and 24. When this potential is one half the power supply voltage, an equal potential is fed to the inverted and non-inverted input terminals of the second and third operational amplifiers 23 and 24. An input offset voltage $V_{OS}$ is set in the second and third operational amplifiers 23 and 24, and with the input of the same potential to the inverted and non-inverted input terminals, the second operational amplifier 23 outputs a high level, while the third operational amplifier 24 outputs a low level. Thus, the p-MOS and n-MOS transistors $Q_{P3}$ and $Q_{N3}$ in the push-pull output stage 19 are turned off, and one half the power supply voltage is outputted from the output terminal of the power operational amplifier.

As shown, in this power operational amplifier either p-MOS transistor $Q_{P3}$ or n-MOS transistor $Q_{N3}$ is "off" irrespective of whether the output voltage is at high, intermediate or low level. This means that no through current is caused to flow from a power supply terminal 1 to a ground terminal 2. That is, the power operational amplifier is a class B power amplifier.

In the above prior art power operational amplifier a through current is caused by suddenly switching the input voltage. Another disadvantage of the amplifier is that the crossover distortion is great. The mechanism of through current generation which is the first disadvantage of this power operational amplifier, will now be described with reference to the timing chart of FIG. 9 and the circuit diagram of FIG. 8.

When the input voltage is inverted from the low level to the high level, the gate voltage on the p-MOS transistor $Q_{P3}$ and the gate voltage on the N-MOS transistor $Q_{N3}$ of the push-pull output stage, are inverted from the high level to the low level after the lapse of a delay time in the first operational amplifier 10 and a delay time in the second and third operational amplifiers 23 and 24, as shown in FIG. 9(b). In either case, the route of the input signal until reaching of the p-MOS and n-MOS transistors $Q_{P3}$ and $Q_{N3}$, passes through two operational amplifier stages, so that the gate voltages turns to be changed simultaneously. When the slew rate of the operational amplifier is set to 10 V/µ sec. and the power supply voltage $V_{DD}$ to 10 V, the time until the end of the gate voltage change is 1µ sec. During this time, the p-MOS and n-MOS transistors $Q_{P3}$ and $Q_{N3}$ in the push-pull output stage 19 are both "on". Thus, through current is caused from the power supply to the ground.

Now, the crossover distortion which is the second drawback, will be described with reference to the circuit diagram of FIG. 8. In the prior art power operational amplifier, an input offset voltage $V_{OS}$ is set in the input state of each of the second and third operational amplifiers 23 and 24 for class B operation. This is done so in order to have both the p-MOS and n-MOS transistors $Q_{P3}$ and $Q_{N3}$ in the push-pull output stage 19 "off" by making the output of the second operational amplifier to be at high level and the output of the third operational amplifier 24 at low level when the output voltage of the first operational amplifier 10 is one half the power supply voltage. The input offset voltage usually has to be set to 200 mV or above. This is so because the input offset voltage is subject to fluctuations by about 20 mV due to manufacturing fluctuations. Because of the manufacturing fluctuations, it is necessary to set a somewhat higher input offset voltage. By setting such an input offset voltage, it is possible to prevent the push-pull output stage through voltage. This input offset voltage setting, however, has an effect of increasing crossover distortion. Specifically, when the output voltage of the power operational amplifier is inverted from the low level to the high level, the push-pull output stage transistor operation is switched from the n-MOS transistor $Q_{N3}$ to the p-MOS transistor $Q_{P3}$. At the instant when the two transistors are turned off, cross-over distortion appears in the output waveform.

SUMMARY OF THE INVENTION

Therefore an object of the present invention is to provide an operational amplifier for class B power amplification which is suitably used for voice coil motors of hard disk drive apparatuses and is capable of preventing AC through current and crossover distortion reduction.

According to the present invention, there is provided an operational amplifier comprising an input stage including a differential amplifier, an output stage having a push-pull structure constituted by a p-channel MOS field-effect transistor and an n-channel MOS field-effect transistor and operable according to the output signal of the differential amplifier, said operational amplifier further comprising: first voltage inverter means provided in a signal transmission path leading from the output terminal of the differential amplifier to the p-channel MOS field-effect transistor, the first voltage inverter means inverting the output voltage of the differential amplifier with a high potential power supply potential as a reference into a voltage with the ground potential as a reference, the inverted voltage signal being used to drive the p-channel MOS field-effect transistor in the push-pull output stage; and a second voltage inverter means provided in a signal transmission path leading from the output terminal of the to the n-channel MOS field-effect transistor, the second voltage inverter inverting the output voltage of the differential amplifier with a ground potential supply potential as reference into a voltage with the high potential as a reference, the inverted voltage signal being used to drive the n-channel MOS field-effect transistor in the push-pull output stage.

The first voltage inverter means includes a current mirror circuit having input side and output side p-channel MOS field-effect transistors with the source electrode side thereof connected to a high potential power supply terminal, the input side transistor being driven by the output signal of the differential amplifier, the p-channel MOS field-effect transistor in the push-pull output stage being driven by a signal taken out from the output side transistor; and the second voltage inverter means includes a current mirror circuit having input side and output side n-channel MOS field-effect transistors with the source electrode side thereof connected to a ground potential supply terminal, the input side transistor being driven by the output signal of the differential amplifier, the n-channel MOS field-effect transistor in the push-pull output stage being driven by a signal taken out from the output side transistor.

The output signal of the first voltage inverter means is transferred through a source follower constituted by a p-channel MOS field-effect transistor to the p-channel MOS field-effect transistor in the push-pull output stage; and the output signal of the second voltage inverter signal is transferred through a source follower constituted by an n-channel MOS field-effect transistor to the n-channel MOS field-effect transistor in the push-pull output stage.

According to another aspect of the present invention, there is provided an operational amplifier comprising: an input stage differential amplifier for differentially amplifying input signals fed to two input terminals; a first current mirror circuit including first and second p-channel MOS field-effect transistors having the individual source electrodes connected commonly to a high potential power supply potential supply terminal and the individual gates connected to each other, the first p-channel MOS field-effect transistor having the gate and drain electrodes connected commonly through a first resistor to the output terminal of the differential amplifier, the second p-channel MOS field-effect transistor having the drain electrode connected through a second resistor to a ground potential supply terminal; a second current mirror circuit including first and second n-channel MOS field-effect transistors having the individual source electrodes connected commonly to the ground potential power supply potential supply terminal and the individual gates connected to each other, the first n-channel MOS field-effect transistor having the gate and drain electrodes connected commonly through a third resistor to the output terminal of the differential amplifier, the second n-channel MOS field-effect transistor having the drain electrode connected through a fourth resistor to the high potential power supply potential supply terminal; and a push-pull structure output stage including a third p-channel MOS field-effect transistor having the source electrode connected to the high potential power supply terminal and the gate electrode connected to the drain electrode of the second p-channel MOS field-effect transistor, and a third n-channel MOS field-effect transistor having the source terminal connected to the ground potential supply terminal and the gate electrode connected to the drain electrode of the second N-channel MOS field-effect transistor, the third p- and n-channel MOS field-effect transistors having the individual drain electrodes being connected in series, the series connection point constituting an output terminal. The signal from the drain electrode of the second p-channel MOS field-effect transistor is transferred to the gate electrode of the third p-channel MOS field-effect transistor through a source follower constituted by a p-channel MOS field-effect transistor; and the signal from the drain electrode of the second n-channel MOS field-effect transistor is transferred to the gate electrode of the third n-channel MOS field-effect transistor through a source follower constituted by n-channel MOS field-effect transistor. The second p- and n-channel MOS field-effect transistors have the individual drain electrodes connected to each other.

Other objects and features will clarified from the following description with reference to attached drawings.

PREFERRED EMBODIMENTS OF THE INVENTION

Figure 1:
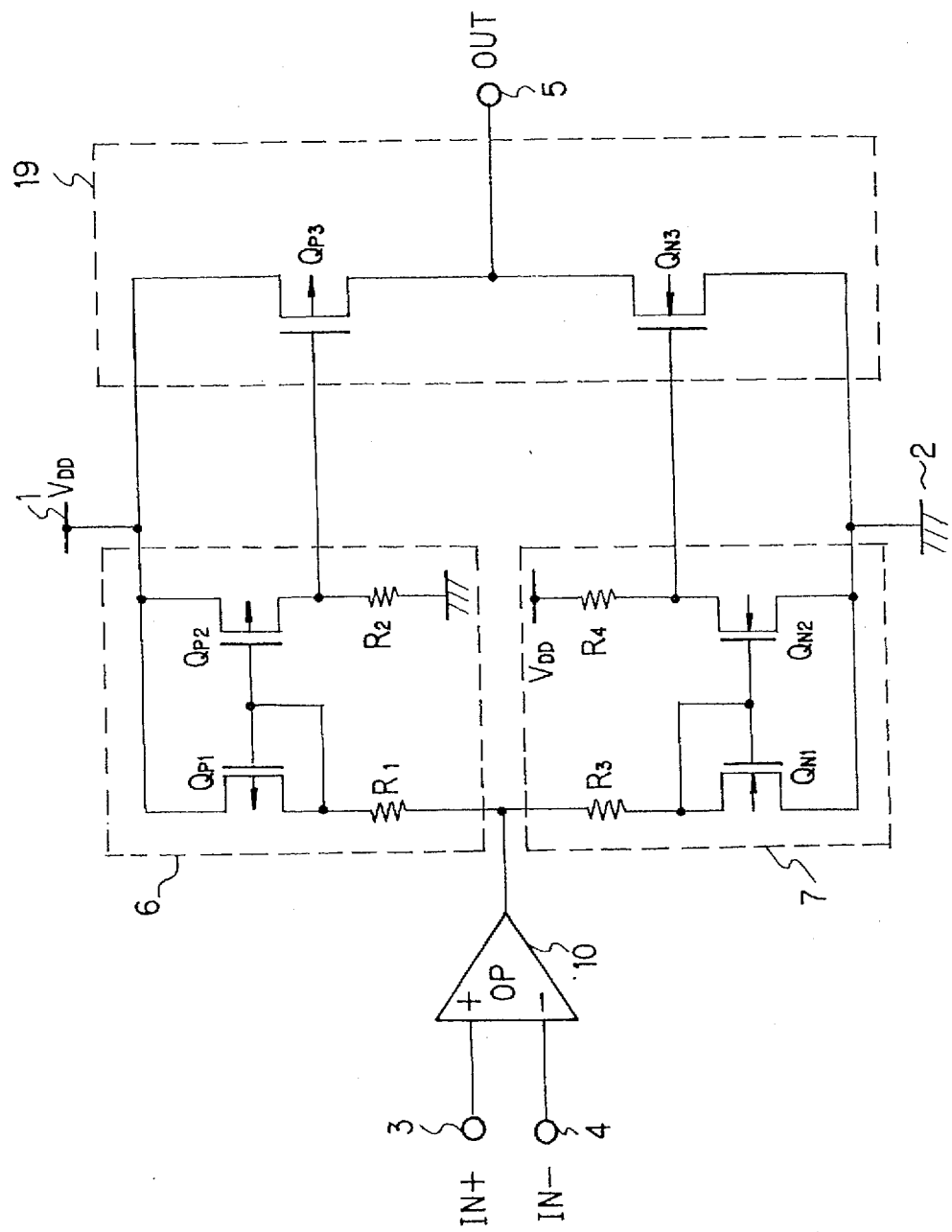
FIG. 1 is a circuit diagram showing a first embodiment of the present invention.

Now preferred embodiments of the present invention will be described with reference to the drawings. FIG. 1 is a circuit diagram showing a first embodiment of the present invention. Referring to FIG. 1, the power operational amplifier comprises an operational amplifier 10, a first current mirror 6, a second current mirror 7 and a push-pull output stage 19. The first current mirror circuit 6 includes p-MOS transistors $Q_{P1}$ and $Q_{P2}$ and pair resistors $R_1$ and $R_2$. The second current mirror circuit 7 includes n-MOS transistors $Q_{N1}$ and $Q_{N2}$ and pair resistors $R_3$ ad $R_4$. The push-pull output stage 19 includes p-MOS and n-MOS transistors $Q_{P2}$ and $N_{N3}$.

Figure 2:
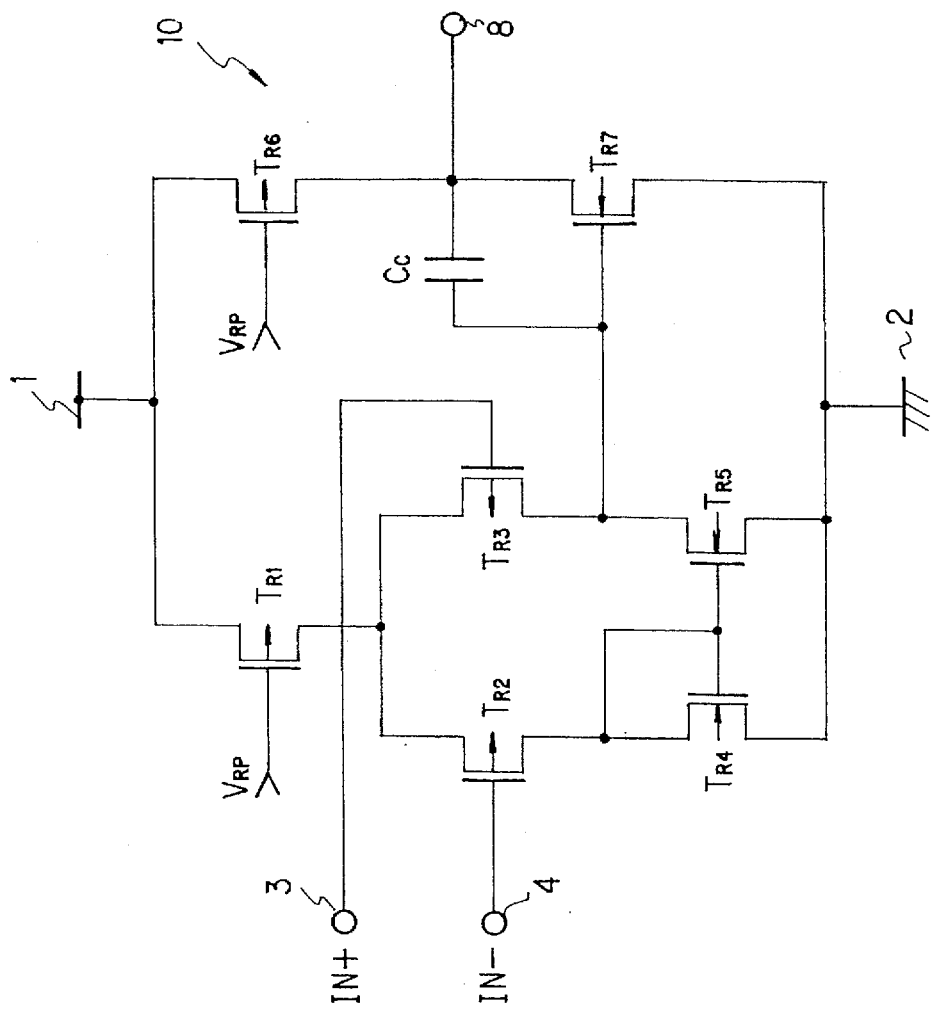
FIG. 2 is a circuit diagram showing an example of operational amplifier 10.

The output of the operational amplifier 10 is fed to the first and second current mirror circuits 6 and 7. The output of the first current mirror circuit 6 is fed to the gate electrode of the p-MOS transistor $QP_3$ of the push-pull output stage 19. The second current mirror circuit 7 is connected to the gate electrode of the n-MOS transistor $Q_{N3}$. FIG. 2 is a circuit diagram showing an example of operational amplifier 10.

The operation of the embodiment will now be described. By making the potential $IN_+$ at the non-inverted terminal 3 of the operational amplifier 10 to be higher than the potential $IN_-$ at the inverted input terminal 4 which is held fixed, a high level signal is produced. This high level signal is fed to the first and second current mirror circuits 6 and 7. The first current mirror circuit 6 thus produces a low level output to turn on the p-MOS transistor $Q_{P3}$ in the push-pull output stage 19. The second current mirror circuit 7 also produces a low level output to turn off the n-MOS transistor $Q_{N3}$. As a result, the output OUT at the output terminal 5 of the power amplifier is inverted to the high level.

By making the potential $IN_-$ at the inverted input terminal 4 of the operational amplifier 10 to be lower than the potential $IN_+$ at the non-inverted input terminal 3, the output OUT at the output terminal 5 of the power amplifier is inverted to the low level by the converse operation.

Figure 3:
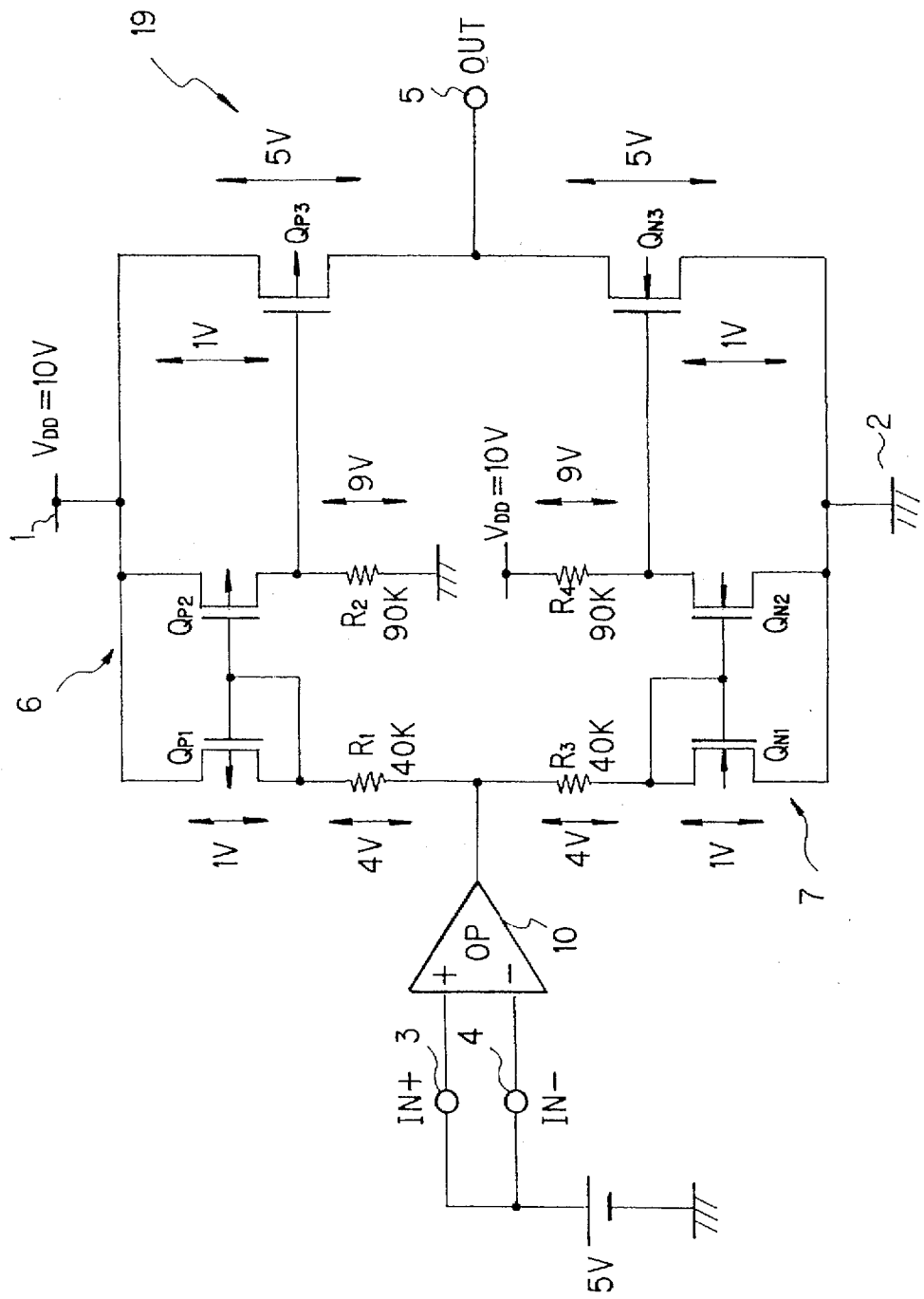
FIG. 3 is a drawing showing voltage distribution of the circuit in FIG. 1 when the voltages of two input terminals are equal.

The operation when the inverted and non-inverted input terminals 4 and 3 of the operational amplifier 10 are at an equal potential, will now be described with reference to the circuit diagram of FIG. 3. For the brevity of the description, it is assumed that the power supply voltage $V_{DD}$ is 10 V and the threshold voltage of each transistor is 1 V. When the inverted and non-inverted input terminals of the operational amplifier 10 are at an equal potential, the operational amplifier 10 provides one half the power supply voltage $V_{DD}$ (=10 V), i.e., 5 V. In this case, 1 V and 4 V are applied across the p-MOS transistor $Q_{P1}$ and resistor $R_1$ constituting the first current mirror circuit 6, respectively. Since the p-MOS transistors $Q_{P1}$ and $Q_{P2}$ constitute a current mirror, with the same transistor size an equal current is caused through the resistors $R_1$ and $R_2$. With the resistance ratio of the resistor $R_1$ to the resistor $R_2$ set to 4/9, 9 V is applied across the resistor $R_2$. Also, 1 V is applied to the gate of the p-MOS transistor $Q_{P3}$ of the push-pull output stage 19. This brings about a state that the transistor $Q_{P3}$ is going to be turned on.

In the meantime, 1 V and 4 V are applied across the n-MOS transistor $Q_{N1}$ and resistor $R_3$ constituting the second current mirror circuit 7, respectively. Since the n-MOS transistors $Q_{N1}$ and $Q_{N2}$ constitute a current mirror, with the same transistor size an equal current is caused through the resistors $R_3$ and $R_4$. With the resistance ratio of the resistor $R_3$ to the resistor $R_4$ to 4/9, 9 V is applied across the resistor $R_4$. Thus, 1 V is applied to the gate of the n-MOS transistor $Q_{N2}$ constituting the push-pull output stage 19, thus bringing about a state that the transistor $Q_{N3}$ is going to be turned on. At this time, no through current is caused since both the p-MOS and n-MOS transistors $Q_{P3}$ and $Q_{N3}$ have not yet been perfectly "on", and the power operational amplifier provides one half the power supply voltage.

As has been shown, in this embodiment of the power operational amplifier either p-MOS transistor $Q_{P3}$ or n-MOS transistor $Q_{N3}$ is "off" irrespective of whether the output voltage is at high, intermediate or low level, and no through current is caused. That is, the power operational amplifier serves as a class B power amplifier.

Figure 4:
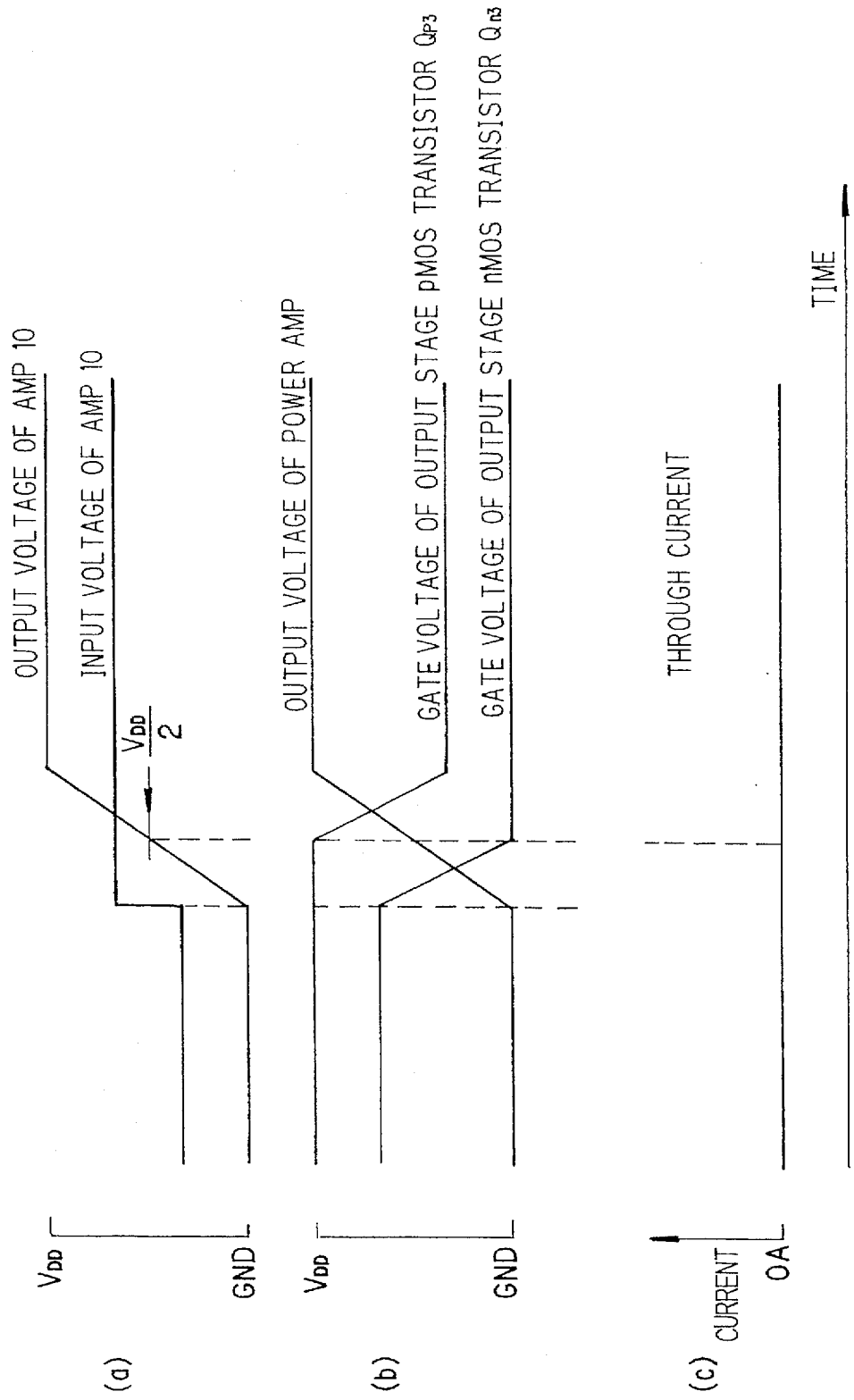
FIG. 4 is timing charts for explaining the operation brought about when the input voltage is quickly switched.

Now, the operation brought about when the input voltage is quickly switched will be described with reference to the timing chart of FIG. 4 and the circuit diagram of FIG. 1. The output voltage of the operational amplifier 10, as shown in FIG. 4(a), is inverted from the low level to the high level with a slope determined by the slew rate. The output of the operational amplifier 10 is fed to the first and second current mirror circuits 6 and 7. The output of the first current mirror circuit 6 drives the gate of the p-MOS $Q_{P3}$ of the push-pull output stage 19. The output of the second current mirror circuit 7 drives the gate of the n-MOS transistor QN3 of the push-pull stage 19.

When the output voltage of the operational amplifier 10 has become one half the power supply voltage $V_{DD}$, as shown in FIG. 4(b), the gate voltage on the P-MOS transistor $Q_{P3}$ in the push-pull output stage 19 has been $V_{DD}$, and the p-MOS transistor $Q_{P3}$ is going to be turned on. On the other hand, the gate voltage on the n-MOS transistor $Q_{N3}$ in the push-pull output stage 19 has been ground level, and the n-MOS transistor $Q_{N3}$ is going to be turned on. Since both the p-MOS and n-MOS transistors $Q_{P3}$ and $Q_{N3}$ have not yet been perfectly "on", no through current is caused, as shown in FIG. 4(c).

In the prior art power operational amplifier, the through current is prevented by producing the state that the two transistors in the push-pull output stage are "off" through input off-set voltage setting. In contrast, with this embodiment of the power operational amplifier, the current mirror circuit resistance is adjusted to reduce the state that the two transistors in the push-pull output stage are going to be turned on, thus preventing the through current. It is thus possible to reduce the time during which the two transistors are both "off", thus reducing the crossover distortion.

Figure 5:
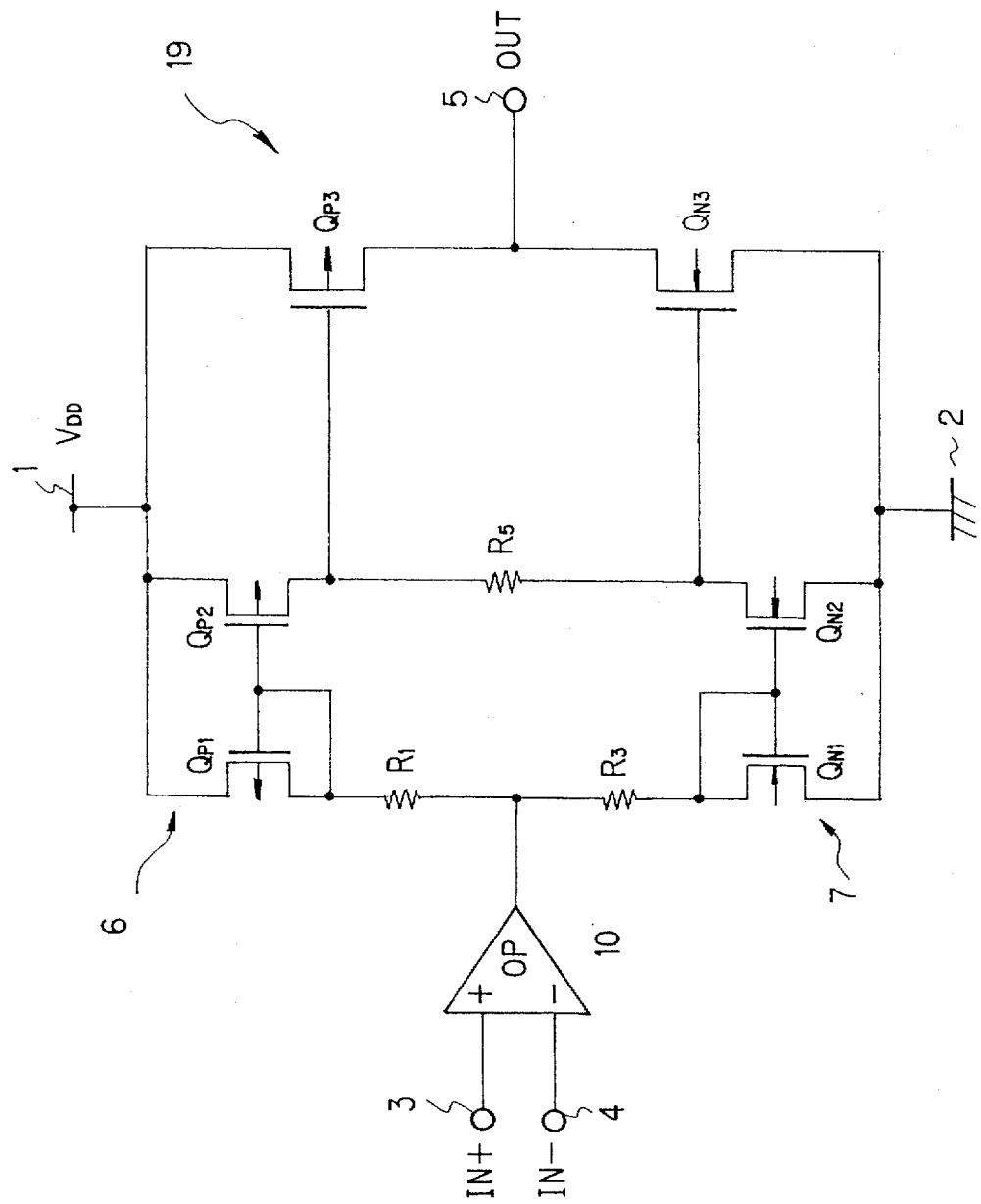
FIG. 5 shows a second embodiment of the power operational amplifier according to the present invention.

A second embodiment of the present invention will be described. FIG. 5 shows a second embodiment of the power operational amplifier according to the present invention. While in the preceding first embodiment the resistor $R_2$ in the first current mirror circuit 6 and the resistor $R_4$ in the second current mirror circuit 7 are provided separately, in the second embodiment these resistors are replaced with a common resistor $R_5$. By setting the resistance of the resistor $R_5$ to the resistance of the resistor $R_3$ or $R_4$ in FIG. 1, the number of resistors can be reduced to reduce the chip area and reduce current consumption in the current mirror circuit.

Figure 6:
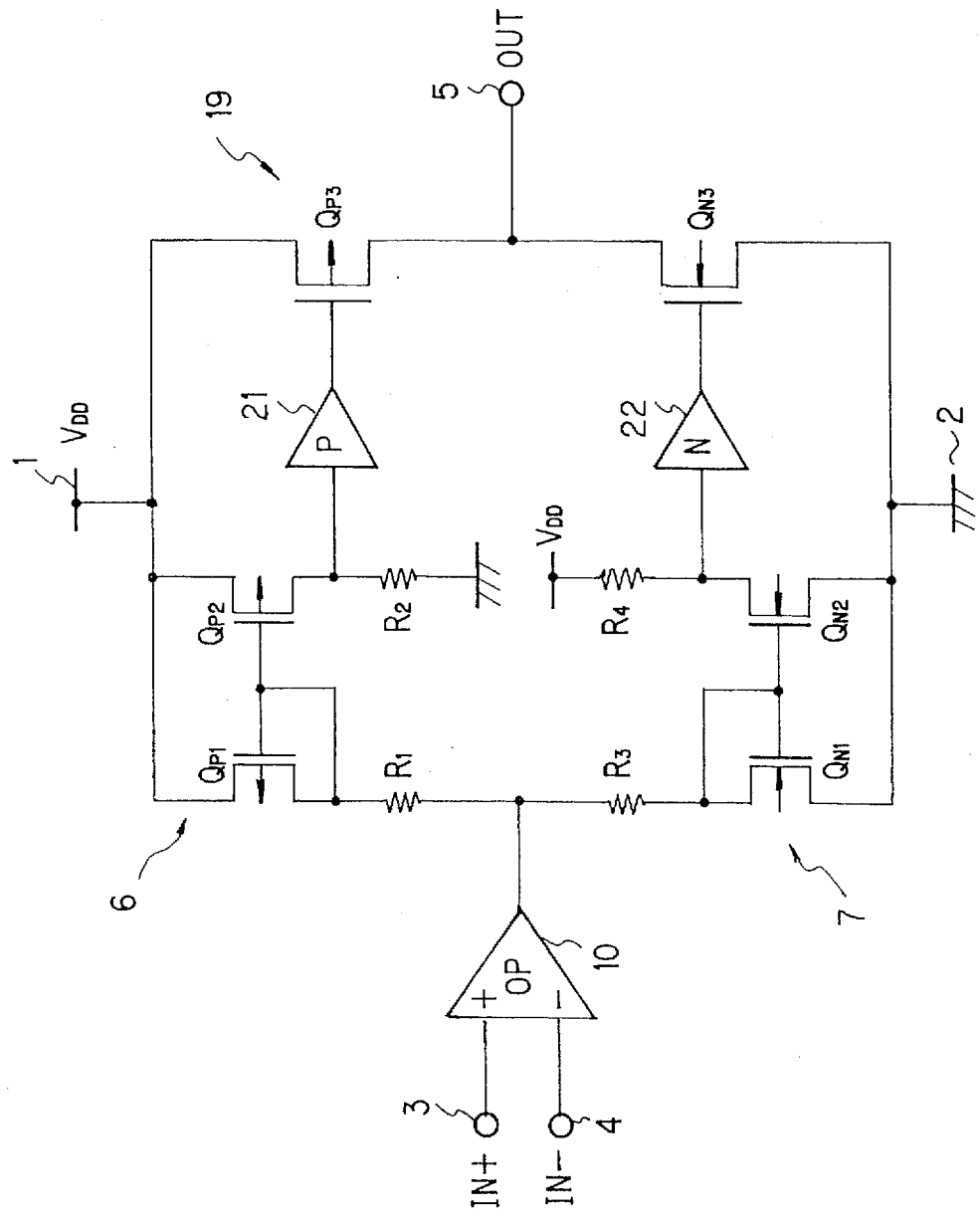
FIG. 6 is a circuit diagram showing a third embodiment of the power operational amplifier according to the present invention.
Figure 7:
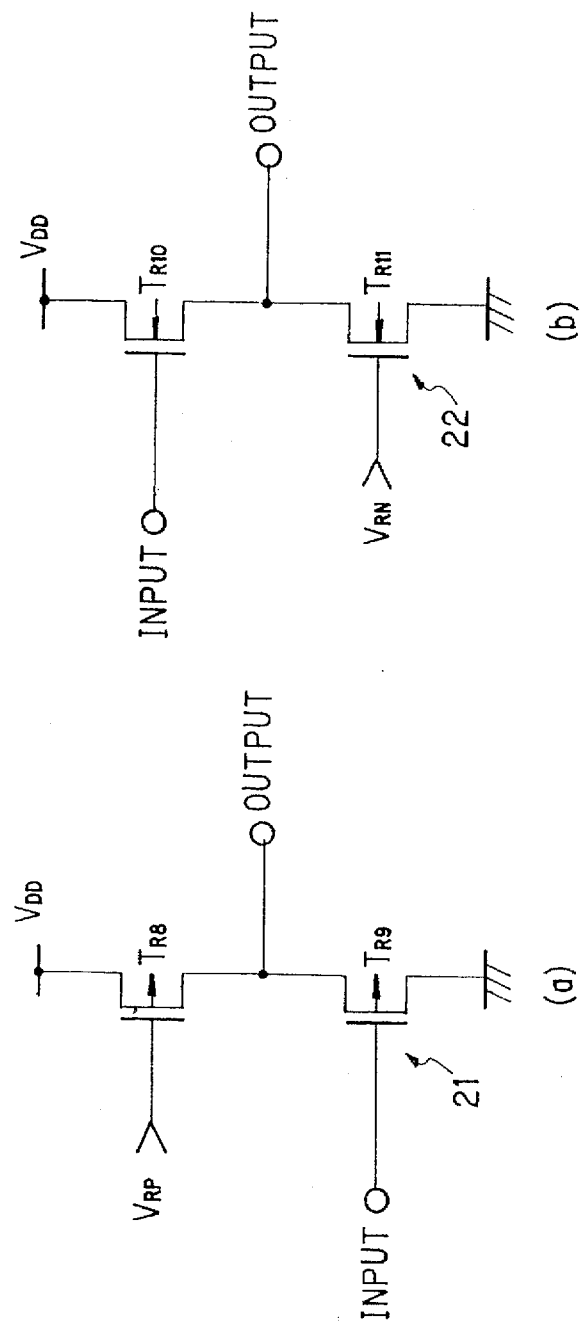
FIG. 7 is circuit diagrams of the buffer 21 and 22 in FIG. 6.
Figure 8:
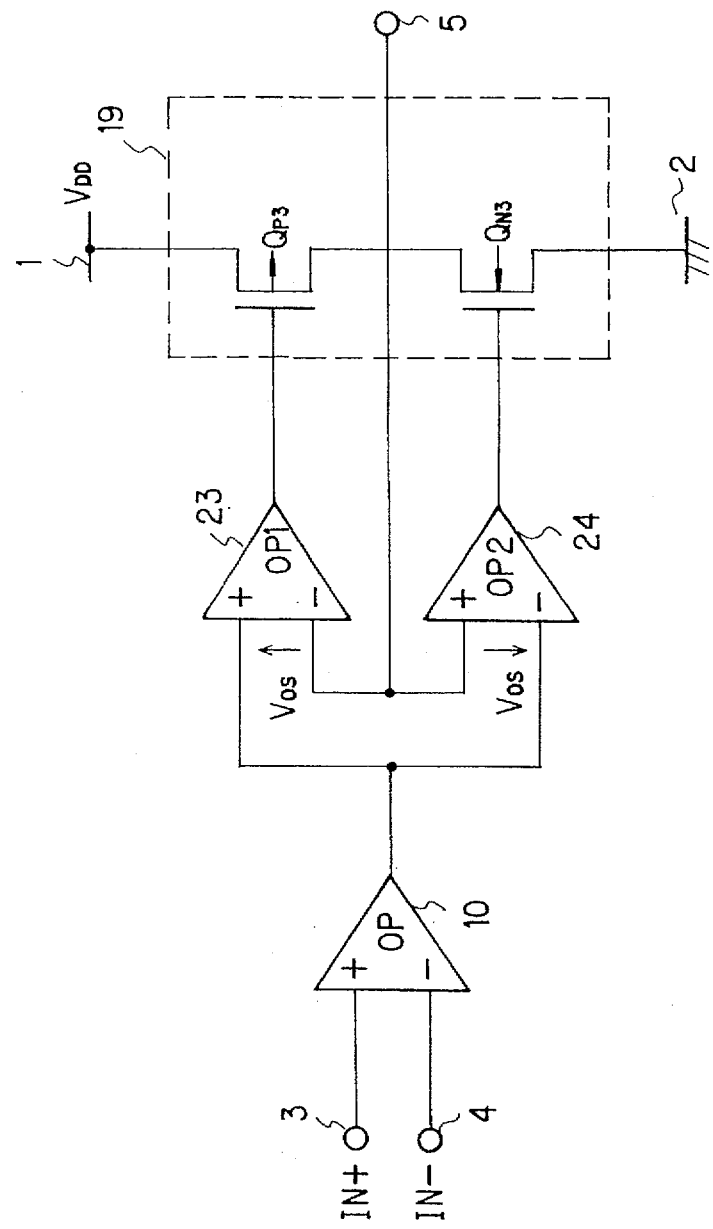
FIG. 8 is a prior power operational amplifier circuit diagram.
Figure 9:
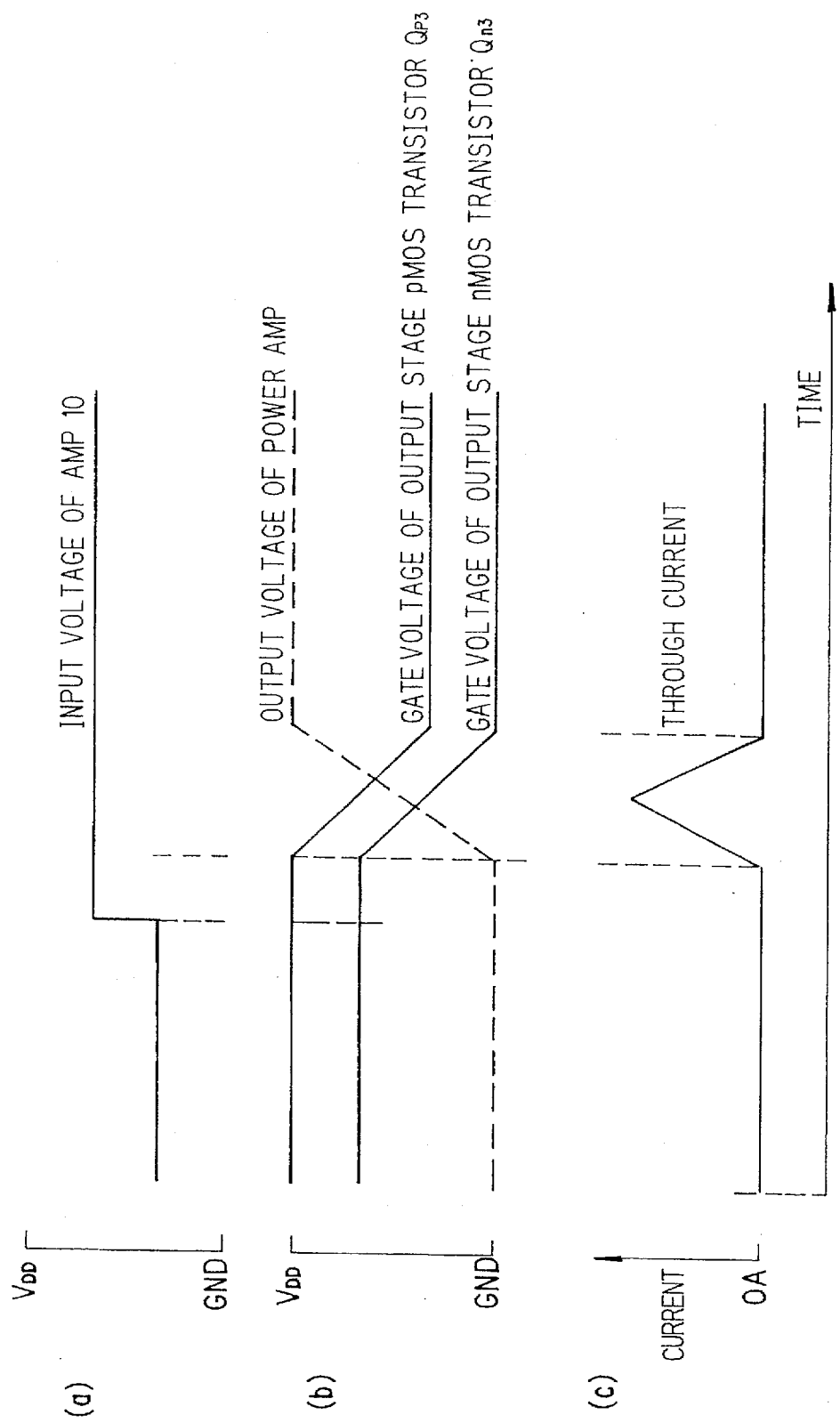
FIG. 9 is operational timing charts of the operational amplifier shown in FIG. 8.

A third embodiment of the present invention will now be described. FIG. 6 is a circuit diagram showing the third embodiment of the power operational amplifier according to the present invention. In this embodiment, a buffer 21 is inserted between the first current mirror circuit 6 and the p-MOS transistor $Q_{P3}$ in the push-pull output stage, and a buffer 22 is inserted between the second current mirror circuit 7 and the n-MOS transistor $Q_{N3}$ of the push-pull output stage 19. FIGS. 7(a) and 7(b) are circuit diagrams showing buffers 21 and 22. The buffer 21 is a source follower having a p-MOS transistor construction, and the buffer 22 is a source follower having the n-MOS transistor construction. The insertion of these buffers permits driving large output transistors even with small drive capacity of the current mirror circuits. It is thus possible to reduce the chip area and reduce power consumption in the current mirror circuits.

As has been described in the foregoing, the operational amplifier according to the present invention comprises an input stage including a differential amplifier, an output state having a push-pull structure constituted by a p-channel MOS field-effect transistor and an n-channel MOS field-effect transistor and operable according to the output signal of the differential amplifier, a first voltage inverter means provided in a signal transmission path leading from the output terminal of the differential amplifier to be p-channel MOS field-effect transistor, the first voltage inverter means inverting the output voltage of the differential amplifier with a high potential power supply potential as a reference into a voltage with the ground potential as a reference, the inverted voltage signal being used to drive the p-channel MOS field-effect transistor in the push-pull output stage, and a second voltage inverter means provided in a signal transmission path leading from the output terminal of the n-channel MOS field-effect transistor, the second voltage inverter inverting the output voltage of the differential amplifier with a ground potential supply potential as reference into a voltage with the high potential as a reference, the inverted voltage signal being used to drive the n-channel MOS field-effect transistor in the push-pull output stage. Thus, according to the present invention, it is possible to eliminate the period, in which both the transistors are simultaneously "off", thus reducing the cross-over distortion. In addition, it is possible to prevent through current that might otherwise be caused when the input voltage is suddenly switched.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. An operational amplifier comprising:
    an input stage differential amplifier for differentially amplifying input signals fed to two input terminals;
    a first current mirror circuit including first and second p-channel MOS field-effect transistors having the individual source electrodes connected commonly to a high potential power supply potential supply terminal and the individual gates connected to each other, the first p-channel MOS field-effect transistor having the gate and drain electrodes connected commonly through a first resistor to the output terminal of the differential amplifier, the second p-channel MOS field-effect transistor having the drain electrode connected through a second resistor to a ground potential supply terminal;
    a second current mirror circuit including first and second n-channel MOS field-effect transistors having the individual source electrodes connected commonly to the ground potential power supply potential supply terminal and the individual gates connected to each other, the first n-channel MOS field-effect transistor having the gate and drain electrodes connected commonly through a third resistor to the output terminal of the differential amplifier, the second n-channel MOS field-effect transistor having the drain electrode connected through a fourth resistor to the high potential power supply potential supply terminal; and
    a push-pull structure output stage including a third p-channel MOS field-effect transistor having the source electrode connected to the high potential power supply potential supply terminal and the gate electrode connected to the drain electrode of the second p-channel MOS field-effect transistor, and a third n-channel MOS field-effect transistor having the source terminal connected to the ground potential supply terminal and the gate electrode connected to the drain electrode of the second N-channel MOS field-effect transistor, the third p- and n-channel MOS field-effect transistors having the individual drain electrodes being connected in series, the series connection point constituting an output terminal.

2. The operational amplifier according to claim 1, wherein:
    the signal from the drain electrode of the second p-channel MOS field-effect transistor is transferred to the gate electrode of the third p-channel MOS field-effect transistor through a source follower constituted by a p-channel MOS field-effect transistor; and
    the signal from the drain electrode of the second n-channel MOS field-effect transistor is transferred to the gate electrode of the third n-channel MOS field-effect transistor through a source follower constituted by n-channel MOS field-effect transistor.

3. An operational amplifier comprising:
    an input stage differential amplifier for differentially amplifying input signals fed to two input terminals;
    a first current mirror circuit including first and second p-channel MOS field-effect transistors having the individual source electrodes connected commonly to a supply terminal of a high potential power supply and the individual gates connected to each other, the first p-channel MOS field-effect transistor having the gate and drain electrodes connected commonly through a first resistor to the output terminal of the differential amplifier;
    a second current mirror circuit including first and second n-channel MOS field-effect transistors having the individual source electrodes connected commonly to a supply terminal of a around potential power supply and the individual gates connected to each other, the first n-channel Mos field-effect transistor having the gate and drain electrodes connected commonly through a second resistor to the output terminal of the differential amplifier, wherein the second p- and n-channel MOS field-effect transistors have the individual drain electrodes connected to each other; and
    a push-pull structure output stage including a third p-channel MOS field-effect transistor having the source electrode connected to the supply terminal of the high potential power supply and the gate electrode connected to the drain electrode of the second p-channel MOS field-effect transistor, and a third n-channel MOS field-effect transistor having the source terminal connected to the ground potential supply terminal and the gate electrode connected to the drain electrode of the second n-channel MOS field-effect transistor, the third p- and n-channel MOS field-effect transistors having the individual drain electrodes being connected in series, the series connection point constituting an output terminal.

4. The operational amplifier according to claim 3 wherein:
    the signal from the drain electrode of the second p-channel MOS field-effect transistor is transferred to the gate electrode of the third p-channel MOS field-effect transistor through a source follower constituted by a p-channel MOS field-effect transistor; and
    the signal from the drain electrode of the second n-channel MOS field-effect transistor is transferred to the gate electrode of the third n-channel MOS field-effect transistor through a source follower constituted by n-channel MOS field-effect transistor.

5. The operational amplifier according to claim 3, which further includes a third resistor connected between the drain electrodes of the second p- and n-channel MOS field-effect transistors.

* * * * *